(12) United States Patent
Song

(10) Patent No.: US 8,213,250 B2
(45) Date of Patent: Jul. 3, 2012

(54) INTEGRATED CIRCUIT AND SEMICONDUCTOR MEMORY DEVICE

(75) Inventor: Keun Soo Song, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 71 days.

(21) Appl. No.: 12/834,744

(22) Filed: Jul. 12, 2010

(65) Prior Publication Data

US 2011/0291762 A1    Dec. 1, 2011

(30) Foreign Application Priority Data

May 28, 2010    (KR) .................. 10-2010-0050431

(51) Int. Cl.
G11C 7/00      (2006.01)
G11C 8/00      (2006.01)
G11C 5/14      (2006.01)

(52) U.S. Cl. ... 365/205; 365/207; 365/208; 365/189.09; 365/226

(58) Field of Classification Search .................. 365/205, 365/207, 208, 189.09, 226
See application file for complete search history.

(56) References Cited

U.S. PATENT DOCUMENTS

| | | | | |
|---|---|---|---|---|
| 5,701,268 A | * | 12/1997 | Lee et al. | 365/205 |
| 5,881,014 A | * | 3/1999 | Ooishi | 365/189.09 |
| 6,424,577 B2 | * | 7/2002 | Sim | 365/205 |
| 6,424,585 B1 | * | 7/2002 | Ooishi | 365/189.09 |
| 6,501,679 B2 | * | 12/2002 | Hidaka | 365/189.09 |
| 6,674,679 B1 | * | 1/2004 | Perner et al. | 365/189.09 |
| 7,016,258 B2 | | 3/2006 | Lim | |
| 7,038,963 B2 | * | 5/2006 | Lee | 365/207 |
| 7,230,862 B2 | | 6/2007 | Kim et al. | |
| 7,272,059 B2 | * | 9/2007 | Vimercati et al. | 365/207 |
| 7,447,100 B2 | * | 11/2008 | Jang | 365/226 |
| 7,554,866 B2 | | 6/2009 | Moon et al. | |
| 7,876,637 B2 | * | 1/2011 | Hirobe | 365/226 |
| 7,990,792 B2 | * | 8/2011 | Abe et al. | 365/207 |
| 2001/0024395 A1 | | 9/2001 | Sim | |
| 2008/0198680 A1 | | 8/2008 | Park | |

FOREIGN PATENT DOCUMENTS

| | | |
|---|---|---|
| KR | 1020050101035 A | 10/2005 |
| KR | 1020060021439 A | 3/2006 |
| KR | 1020060126164 A | 12/2006 |
| KR | 1020070078793 A | 8/2007 |
| KR | 1020070080455 A | 8/2007 |
| KR | 1020070087456 A | 8/2007 |
| KR | 1020070117963 A | 12/2007 |
| KR | 1020080051847 A | 6/2008 |
| KR | 1020090070493 A | 7/2009 |
| KR | 1020090072394 A | 7/2009 |

* cited by examiner

Primary Examiner — Trong Phan

(57) ABSTRACT

A semiconductor memory device includes a cell array including a plurality of unit cells, a first amplification circuit amplifying an input signal received from at least one unit cell among the unit cells, a signal transmission unit to transmit the signal to the first amplification circuit in response to a selection signal, first amplification control circuit to output a first amplification control signal controlling an amplification operation of the first amplification circuit, a second amplification circuit to amplify an output signal of the first amplification circuit, a second amplification control circuit to output a second amplification control signal controlling an amplification operation of the second amplification circuit, and a voltage adjustment circuit to adjust an internal voltage of the first amplification circuit in response to a voltage adjustment signal before the first and second amplification circuits perform the amplification operation.

34 Claims, 14 Drawing Sheets

INTEGRATED CIRCUIT AND SEMICONDUCTOR MEMORY DEVICE

CROSS-REFERENCE TO RELATED APPLICATION

The priority of Korean patent application No. 10-2010-0050431 filed on 28 May 2010, the disclosure of which is hereby incorporated in its entirety by reference, is claimed.

BACKGROUND OF THE INVENTION

Embodiments of the present invention relate to an integrated circuit and a semiconductor memory device.

Various types of integrated circuits have been used in a semiconductor memory device. Specifically, an amplification circuit among the integrated circuits amplifies an input signal, and outputs an amplified input signal.

Although increasing an amplification rate is important in such an amplification circuit, it is much more important to accurately control a margin of an input signal in an amplification circuit for amplifying a small-sized or low-level signal.

For example, an input margin of 20 mV is generally required between inputs signals of a differential amplification circuit. However, if noise is generated, and the input margin between the input signals is reduced to 10 mV, the differential amplification circuit cannot start an amplification operation, such that a semiconductor memory device including the differential amplification circuit does not operate normally.

BRIEF SUMMARY OF THE INVENTION

Various embodiments of the present invention are directed to providing an integrated circuit and a semiconductor memory device that substantially obviate one or more problems due to limitations and disadvantages of the related art.

An embodiment of the present invention relates to an integrated circuit and a semiconductor memory device for adjusting an internal voltage of an amplification circuit using a voltage adjustment circuit, thereby substantially preventing noise from being generated in an input signal of the amplification circuit.

In accordance with one embodiment of the present invention, there is provided an integrated circuit including an amplification circuit configured to amplify an input signal, an amplification control circuit configured to output an amplification control signal for controlling an amplification operation of the amplification circuit, and a voltage adjustment circuit configured to output a voltage adjustment signal for adjusting an internal voltage of the amplification circuit before the amplification circuit performs the amplification operation.

In accordance with another embodiment of the present invention, a semiconductor memory device includes a cell array including a plurality of unit cells, an amplification circuit configured to amplify an input signal received from at least one unit cell among the plurality of unit cells, a signal transmission unit configured to transmit the input signal to the amplification circuit in response to a selection signal, an amplification control circuit configured to output an amplification control signal for controlling an amplification operation of the amplification circuit, and a voltage adjustment circuit configured to output a voltage adjustment signal for adjusting an internal voltage of the amplification circuit before the amplification circuit performs the amplification operation.

In accordance with another embodiment of the present invention, there is provided an integrated circuit including a first amplification circuit configured to amplify an input signal, a first amplification control circuit configured to output a first amplification control signal for controlling an amplification operation of the first amplification circuit, a second amplification circuit configured to amplify an output signal of the first amplification circuit, a second amplification control circuit configured to output a second amplification control signal for controlling an amplification operation of the second amplification circuit, and a voltage adjustment circuit configured to output a voltage adjustment signal for adjusting an internal voltage of the first amplification circuit before the first and second amplification circuits perform the amplification operation.

In accordance with another embodiment of the present invention, a semiconductor memory device includes a cell array including a plurality of unit cells, a first amplification circuit configured to amplify an input signal received from at least one unit cell among the plurality of unit cells, a signal transmission unit configured to transmit the input signal to the first amplification circuit in response to a selection signal, first amplification control circuit configured to output a first amplification control signal for controlling an amplification operation of the first amplification circuit, a second amplification circuit configured to amplify an output signal of the first amplification circuit, a second amplification control circuit configured to output a second amplification control signal for controlling an amplification operation of the second amplification circuit, and a voltage adjustment circuit configured to output a voltage adjustment signal for adjusting an internal voltage of the first amplification circuit before the first and second amplification circuits perform the amplification operation.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Figure 1:
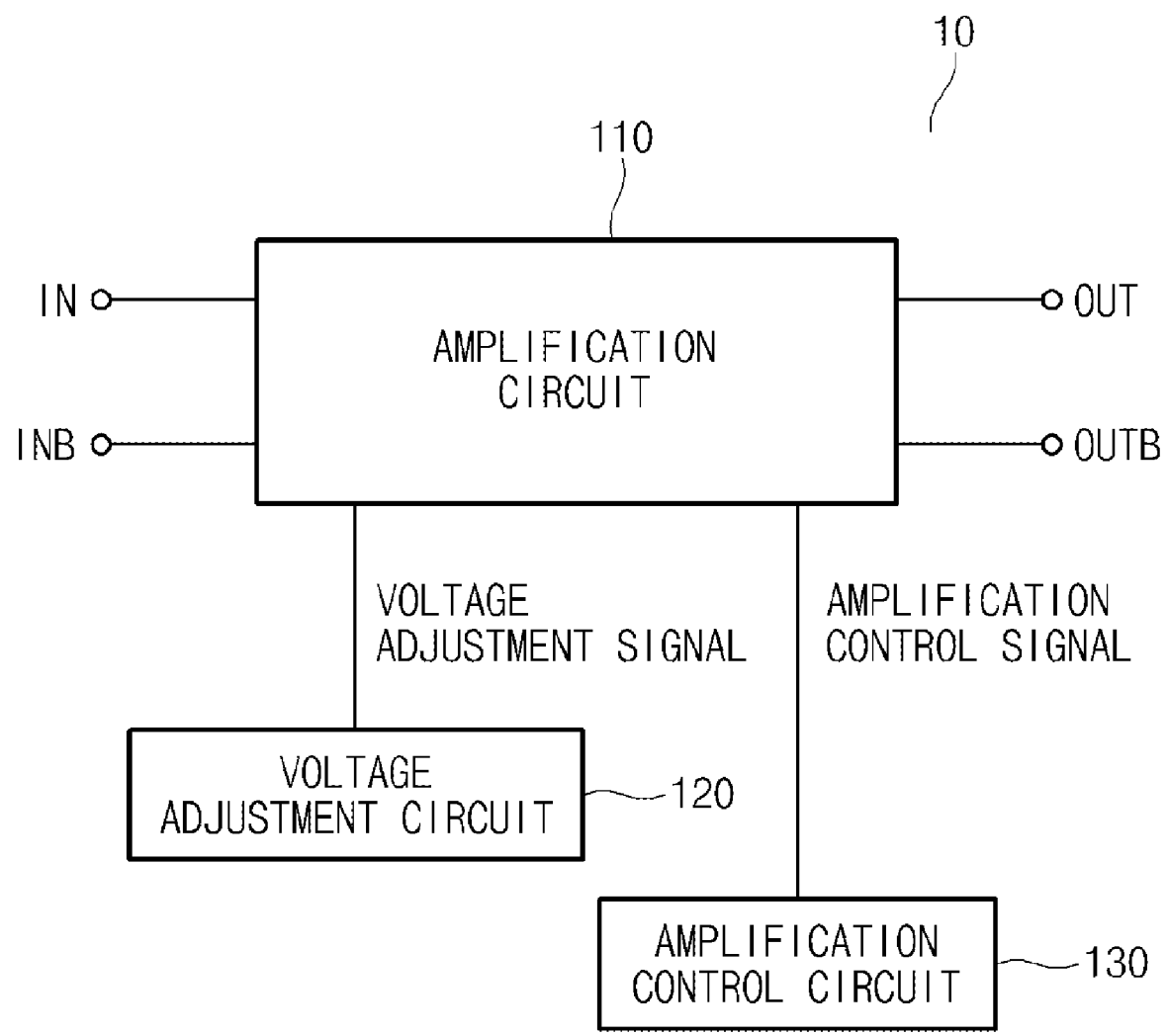
FIG. 1 is a block diagram illustrating an integrated circuit according to an embodiment of the present invention.

FIG. 1 is a block diagram illustrating an integrated circuit according to an embodiment of the present invention.

Referring to FIG. 1, the integrated circuit 10 includes an amplification circuit 110, a voltage adjustment circuit 120, and an amplification control circuit 130.

The amplification circuit 110 amplifies input signals IN and INB, and generates output signals OUT and OUTB.

The voltage adjustment circuit 120 is adapted to adjust an internal voltage level of the amplification circuit 110. The voltage adjustment circuit 120 outputs a voltage adjustment signal.

The amplification control circuit 130 controls an amplification operation of the amplification circuit 110. If the amplification control circuit 130 is activated and outputs an enabled amplification control signal, the amplification circuit 110 performs the amplification operation in response to the enabled amplification control signal. Otherwise, if the amplification control circuit 130 is deactivated and outputs a disabled amplification control signal, the amplification circuit 110 stops the amplification operation in response to the disabled amplification control signal.

Figure 2:
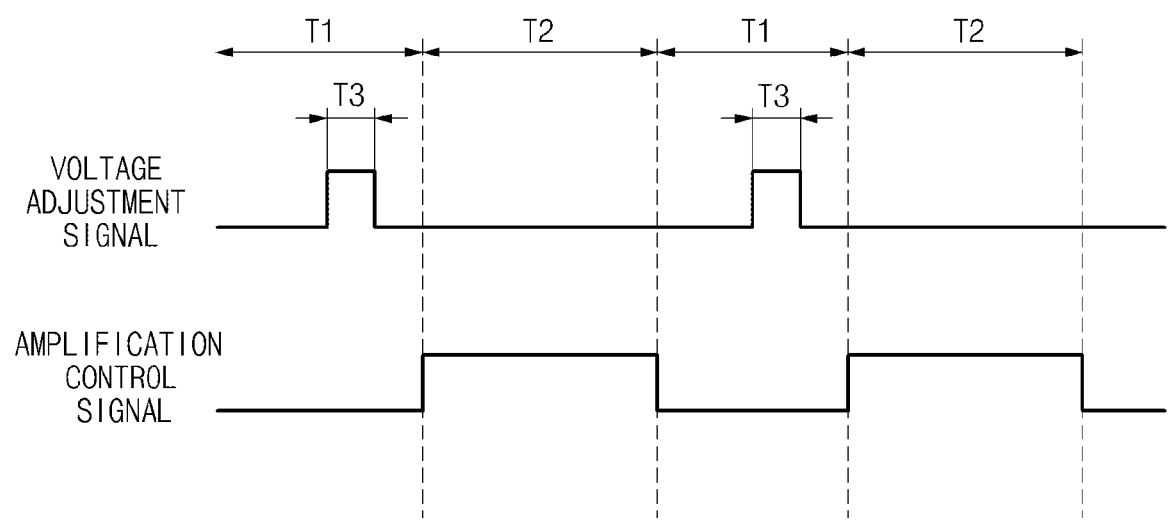
FIG. 2 is a timing diagram illustrating an operation of the integrated circuit shown in FIG. 1 according to an embodiment of the present invention.

FIG. 2 is a timing diagram illustrating an operation of the integrated circuit shown in FIG. 1 according to an embodiment of the present invention.

Referring to FIG. 2, the voltage adjustment circuit 120 activates the voltage adjustment signal for a third interval T3 contained in a first interval T1 in which the amplification control signal is deactivated. As a result, before the amplification circuit 110 performs the amplification operation, the internal voltage of the amplification circuit 110 can be adjusted to a specific voltage level. In this case, the third interval T3 is contained in the first interval T1, and the length of the third interval T3 may be set by a user.

If the voltage adjustment circuit 120 adjusts the internal voltage level of the amplification circuit 110 during the third interval T3, the amplification control circuit 130 outputs the enabled amplification control signal. As a result, the amplification circuit 110 performs the amplification operation during a second interval T2, and then outputs the output signals OUT and OUTB.

Figure 3:
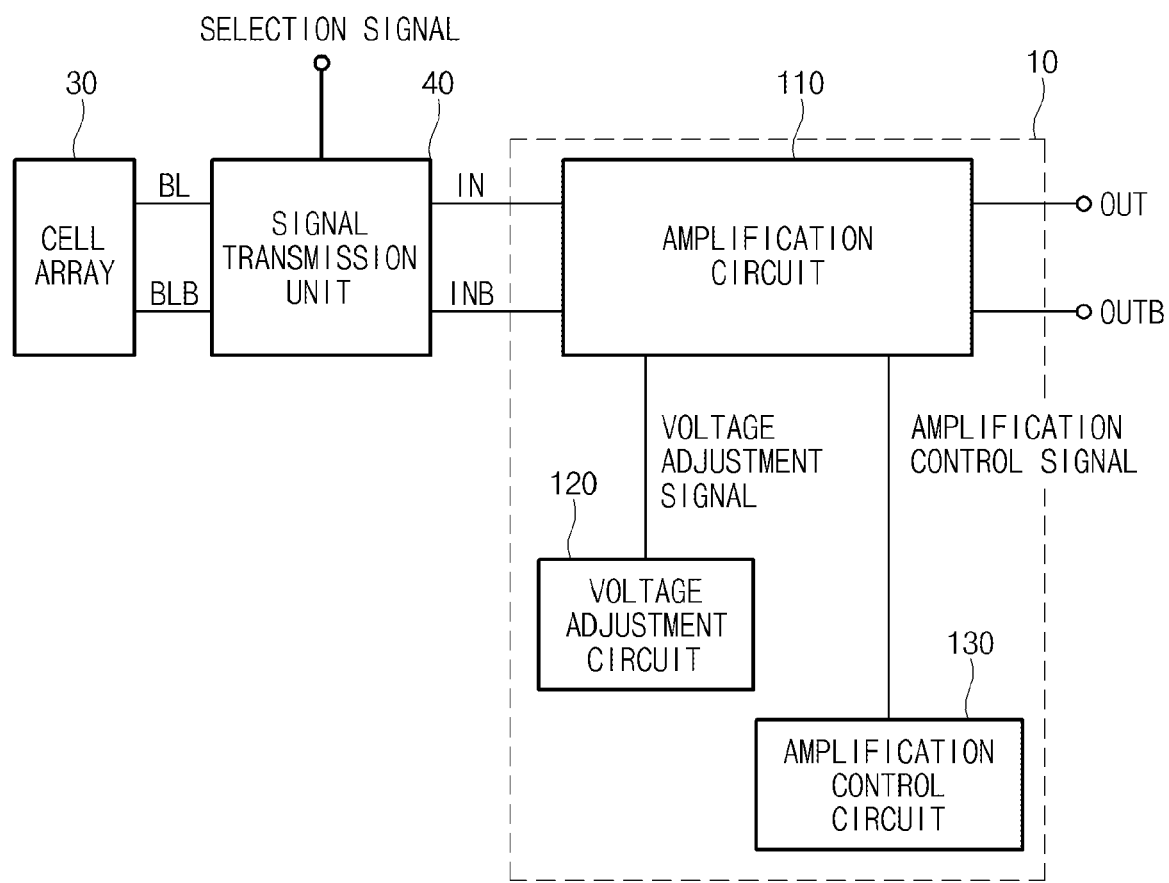
FIG. 3 is a block diagram illustrating a semiconductor memory device including the integrated circuit shown in FIG. 1 according to an embodiment of the present invention.

FIG. 3 is a block diagram illustrating a semiconductor memory device including the integrated circuit shown in FIG. 1. In more detail, FIG. 3 illustrates a semiconductor memory device in which the integrated circuit shown in FIG. 1 is used as a sense-amplifier (S/A).

Referring to FIG. 3, the semiconductor memory device includes an integrated circuit 10, a cell array 30, and a signal transmission unit 40. In the same manner as in FIG. 1, the integrated circuit 10 of FIG. 3 includes an amplification circuit 110, a voltage adjustment circuit 120, and an amplification control circuit 130. The operations of the integrated circuit 10 have already been described in FIG. 1. Therefore, the remaining constituent elements other than the above circuits 110, 120 and 130 and operational principles of the semiconductor memory device will hereinafter be described in detail.

The cell array 30 includes a plurality of unit cells. Each unit cell includes a memory device. For example, a capacitor, a magnetic resistance element, a phase change resistance element, a ferroelectric element, etc. may be used as the memory device. The integrated circuit according to an embodiment of the present invention can be applied to all types of semiconductor memory devices, which are capable of amplifying a current signal from a memory element contained in a unit cell, irrespective of memory device types.

The signal transmission unit 40 transmits current signals from the cell array 30 through a pair of bit lines BL and BLB to the amplification circuit 110. If a selection signal is activated, the signal transmission unit 40 transmits the current signals through the bit-line pair BL and BLB to the amplification circuit 110. Otherwise, if the selection signal is deactivated, the signal transmission unit 40 does not transmit the current signals through the bit-line pair BL and BLB to the amplification circuit 110.

The signal transmission unit 40 may include a switching element. For example, a metal oxide semiconductor (MOS) transistor, a bipolar junction transistor, etc. may be used as the switching element, but the scope or spirit of the present invention is not limited only thereto, and other switching elements can also be used in the present invention.

Figure 4:
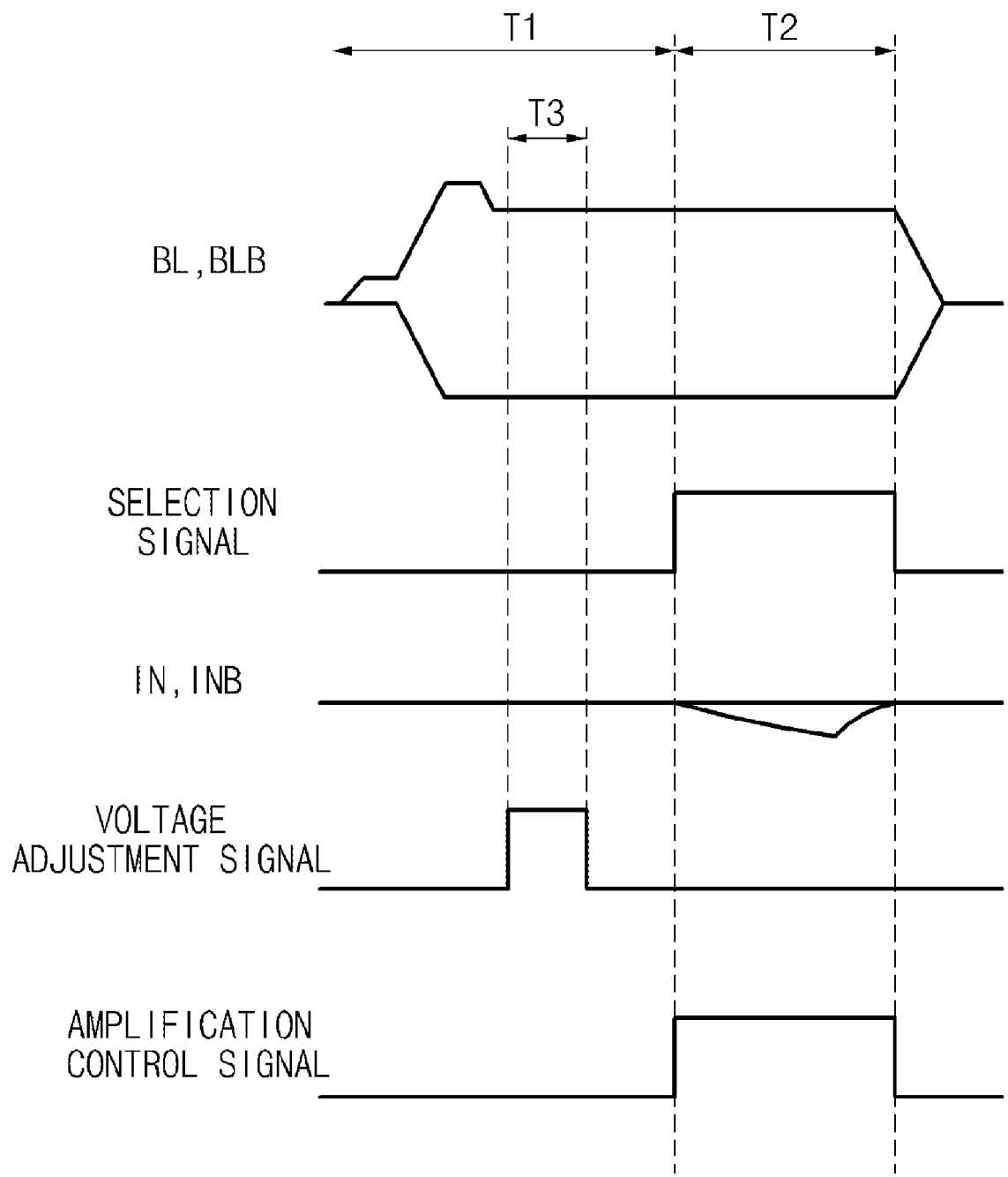
FIG. 4 is a timing diagram illustrating an operation of the semiconductor memory device shown in FIG. 3 according to an embodiment of the present invention.

FIG. 4 is a timing diagram illustrating an operation of the semiconductor memory device shown in FIG. 3 according to an embodiment of the present invention.

Referring to FIG. 4, prior to the beginning of a read operation of the semiconductor memory device including the integrated circuit, the same voltage level is maintained in the pair of bit lines BL and BLB. For example, voltage levels of the bit lines BL and BLB may be set to 0V or a precharge voltage level.

When the read operation for a specific unit cell contained in the cell array 30 starts, a current signal begins to flow through the bit-line pair BL and BLB. However, during a first interval T1 in which a selection signal is deactivated, the current signal that flows through the bit-line pair BL and BLB is not transferred to the amplification circuit 110 through the signal transmission unit 40.

Meanwhile, in the second interval T2 in which the selection signal is activated, a current (or a current signal) from the cell array 30 is input to the amplification circuit 110. That is, input signals IN and INB of the amplification circuit 110 are maintained at the same voltage level when the supply of current is blocked by the signal transmission unit 40. After that, if the supply of current begins by a switching operation of the signal transmission unit 40, there arises a difference in voltage levels between the input signals IN and INB, and this difference is gradually increased. In contrast, if the signal transmission unit 40 is re-switched and the supply of current is re-blocked, the voltage levels of the input signals IN and INB are again maintained at the same level.

As can be seen from the above description, in the integrated circuit 10 according to an embodiment of the present invention, during the third interval T3 where a voltage adjustment signal is activated, the voltage adjustment circuit 120 adjusts an internal voltage level of the amplification circuit 110 to a specific voltage level. Herein, the third interval T3 is contained in the first interval T1 where the selection signal and the amplification control signal are deactivated. For example, the voltage adjustment circuit 120 may adjust each internal voltage level of the amplification circuit 110 to a ground-voltage level in response to the voltage adjustment signal. As a result, it is possible to substantially prevent noise from being generated in voltage levels of the input signals IN and INB by an unexpected internal voltage that may be generated in the amplification circuit 110.

In more detail, in the case where the voltage adjustment signal is not used, the voltage levels of the input signals IN and INB may not be maintained at the same value owing to noise generated by internal parasitic capacitance of the amplification circuit 110. The amplification circuit 110 correctly achieves the amplification operation only under a predetermined condition in which the voltage levels of the input signals IN and INB are correctly controlled. Assuming that noise occurs, the amplification circuit 110 may perform an undesired amplification operation, or a necessary amplification operation may not be unexpectedly performed.

However, assuming that the voltage adjustment circuit 120 correctly adjusts the internal voltage level of the amplification circuit 110 prior to the execution of the amplification operation, a margin of the input signals IN and INB can be correctly controlled, such that the amplification circuit 110 can accurately perform the amplification operation.

In the above-mentioned embodiment, the third interval T3 for activating the voltage adjustment signal may be contained in the first interval T1, and the length of an activation interval of the third interval T3 may be changed according to the user's setup information.

After the voltage adjustment circuit 120 adjusts the internal voltage level of the amplification circuit 110 in response to the voltage adjustment signal during the third interval T3, the amplification circuit 110 amplifies a voltage difference between the input signals IN and INB during the second interval T2 in which an amplification control signal is activated, and thus outputs output signals OUT and OUTB.

Figure 5:
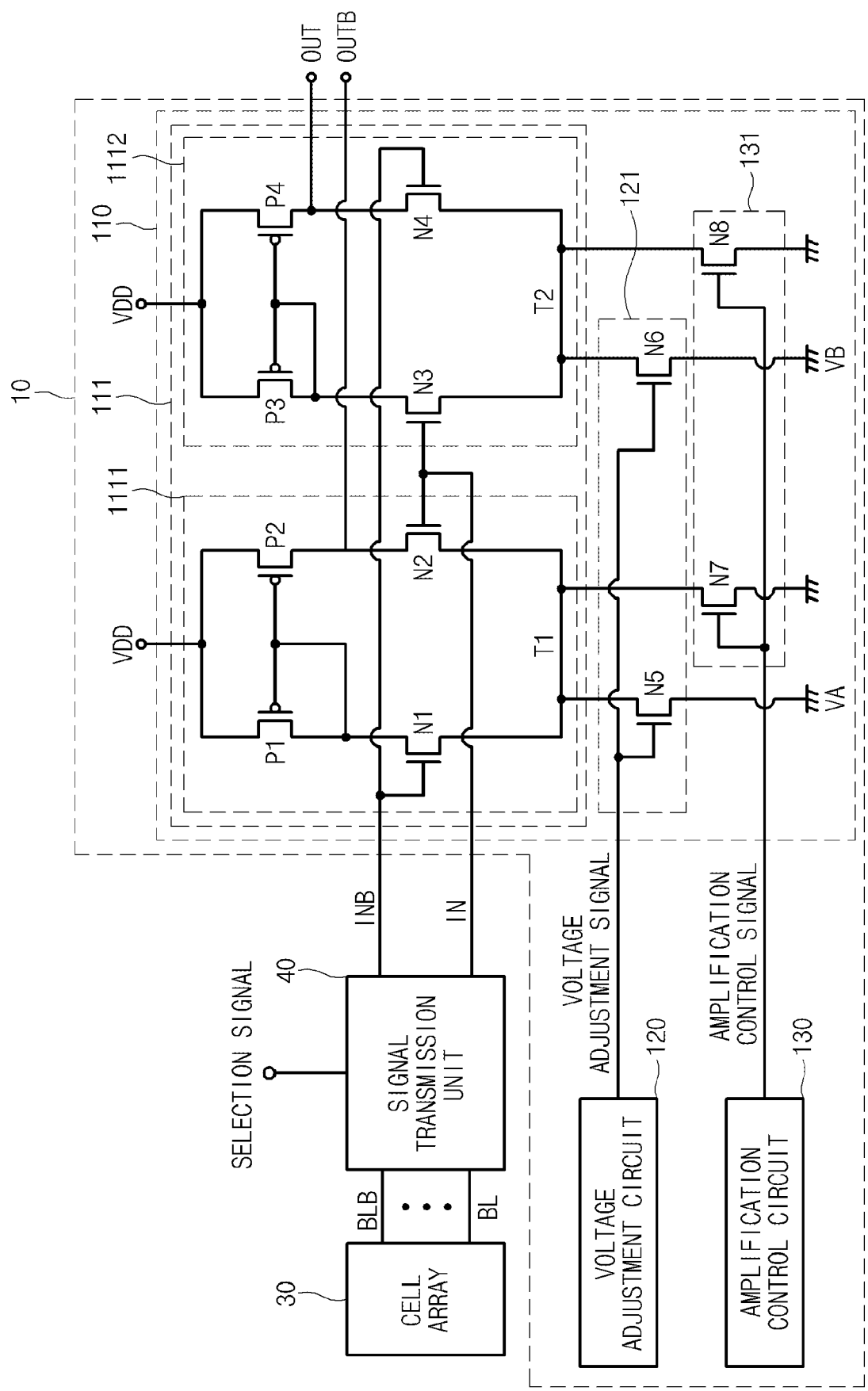
FIG. 5 is a circuit diagram illustrating a semiconductor memory device according to an embodiment of the present invention.

FIG. 5 is a circuit diagram illustrating a semiconductor memory device according to an embodiment of the present invention.

Referring to FIG. 5, the semiconductor memory device includes an integrated circuit 10, a cell array 30, and a signal transmission unit 40.

The semiconductor memory device shown in FIG. 5 has the same basic circuit structure as in FIG. 3, and thus internal circuits of the integrated circuit 10 will hereinafter be described in detail with reference to the accompanying drawings.

Referring to FIG. 5, the integrated circuit 10 includes an amplification circuit 110, a voltage adjustment circuit 120 and an amplification control circuit 130. The amplification circuit 110 includes an amplification unit 111, an adjustment voltage supply unit 121, and an amplification activation unit 131.

The amplification unit 111 includes a first amplification unit 1111 and a second amplification unit 1112.

The first amplification unit 1111 and the second amplification unit 1112 respectively receive input signals IN and INB and amplify a voltage difference between the input signals IN and INB.

In more detail, the first amplification unit 1111 amplifies the voltage difference between the input signals IN and INB, and generates an output signal OUTB. The second amplification unit 1112 amplifies the voltage difference between the input signals IN and INB, and generates an output signal OUT. Voltage levels of the output signals OUT and OUTB are dependent upon characteristics of individual transistors contained in the first and second amplification units 1111 and 1112.

In more detail, in the first amplification unit 1111, PMOS transistors P1 and P2 operate as loads, and NMOS transistors N1 and N2 adjust the magnitude of current passing therethrough in response to the input signals IN and INB, such that a voltage level of the output signal OUTB is determined.

For example, assuming that the PMOS transistor P2 has a large load and the magnitude of current passing through the NMOS transistor N2 is large, a voltage induced to the PMOS transistor P2 serving as a load increases, such that the output signal OUTB becomes a low voltage level.

In contrast, assuming that the PMOS transistor P2 has a small load and the magnitude of current passing through the NMOS transistor N2 is small, the voltage induced to the PMOS transistor P2 decreases, such that the output signal OUTB becomes a high voltage level.

In the same manner as in the first amplification unit 1111, in the second amplification unit 1112, PMOS transistors P3 and P4 operate as loads, and NMOS transistors N3 and N4 adjust the magnitude of current passing therethrough in response to the input signals IN and INB, such that a voltage level of the output signal OUT is determined.

For example, assuming that the PMOS transistor P4 has a large load and the magnitude of current passing through the NMOS transistor N4 is large, a voltage induced to the PMOS transistor P4 serving as a load increases, such that the output signal OUT becomes a low voltage level.

In contrast, assuming that the PMOS transistor P4 has a small load and the magnitude of current passing through the NMOS transistor N4 is small, the voltage induced to the PMOS transistor P4 decreases, such that the output signal OUT becomes a high voltage level.

The adjustment voltage supply unit 121 is coupled between an adjustment voltage supply terminal and each of internal nodes T1 and T2 of the amplification unit 111, and performs a switching operation in response to the voltage adjustment signal supplied from the voltage adjustment circuit 120. As can be seen from FIG. 5, the adjustment voltage supply unit 121 includes an NMOS transistor N5 and an NMOS transistor N6. The NMOS transistor N5 is used as a first adjustment voltage supply unit for coupling the first amplification unit 1111 to a first voltage (VA) terminal. The NMOS transistor N6 is used as a second adjustment voltage supply unit for coupling the second amplification unit 1112 to a second voltage (VB) terminal.

In this case, the voltage adjustment signal is input to gate terminals of the NMOS transistors N5 and N6, and drain terminals of the NMOS transistor N5 and N6 are connected to the nodes T1 and T2, respectively, and source terminals of the NMOS transistors N5 and N6 are connected to the VA and VB terminals, respectively.

By means of the voltage adjustment signal, which is activated before the selection signal is activated (i.e., before the current is applied from the cell array 30 to the amplification unit 111 through the bit-line pair BL and BLB), the adjustment voltage supply unit 121 adjusts a voltage level of the node T1 to a first voltage level VA, and a voltage level of the node T2 to a second voltage level VB.

For example, the first voltage level VA and the second voltage level VB may be set to a ground voltage level. In this case, since the amount of electric charge stored in the node T1 or T2 may be zero, noise caused by parasitic capacitance generated between the node T1 or T2 and the input signals IN and INB can be substantially prevented.

The amplification activation unit 131 is coupled between a ground terminal and the nodes T1 and T2 of the amplification unit 111, and performs a switching operation in response to the amplification control signal supplied from the amplification control circuit 130. As shown in FIG. 5, the amplification activation unit 131 includes an NMOS transistor N7 for coupling the first amplification unit 1111 to the ground terminal, and an NMOS transistor N8 for coupling the second amplification unit 1112 to the ground terminal.

In this case, the amplification control signal is input to gate terminals of the NMOS transistors N7 and N8. The drain terminals of the NMOS transistors N7 and N8 are coupled to the nodes T1 and T2, respectively and source terminals thereof are coupled to the ground terminal.

If the amplification control signal is activated after the selection signal is activated, the amplification activation unit 131 couples the nodes T1 and T2 to the ground terminal, such that it allows the amplification unit 111 to perform the amplification operation. That is, it is impossible for the current to flow in the amplification unit 111 under the condition that the NMOS transistors N7 and N8 of the amplification activation unit 131 are turned off. Therefore, although there is a voltage difference between the input signals IN and INB, it is impossible for the amplification unit 111 to amplify this voltage difference. On the other hand, if the NMOS transistors N7 and N8 of the amplification activation unit 131 are turned on, current flows in the amplification unit 111, such that the amplification unit 111 can perform the amplification operation.

Figure 6:
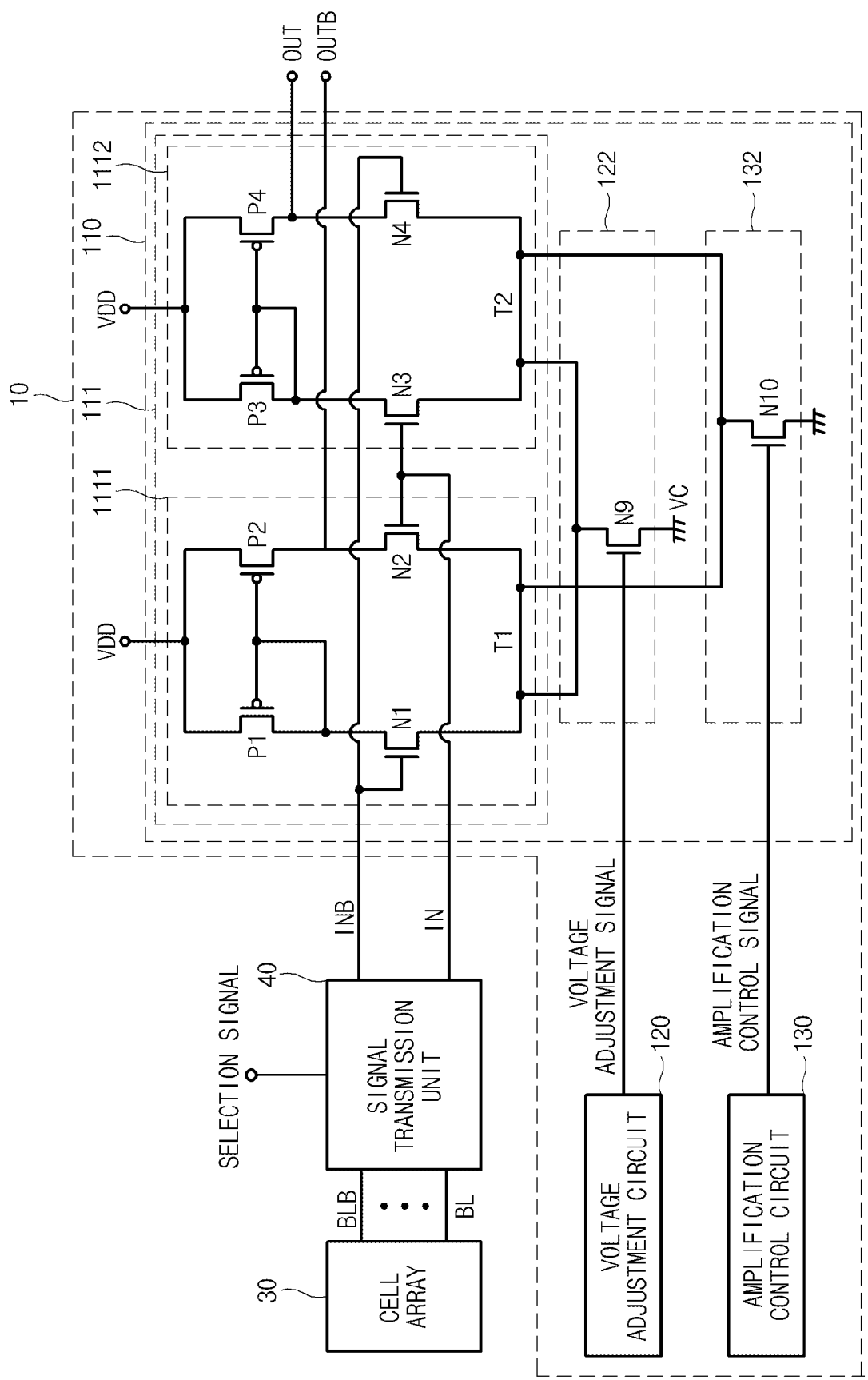
FIG. 6 is a circuit diagram illustrating a semiconductor memory device according to another embodiment of the present invention.

FIG. 6 is a circuit diagram illustrating a semiconductor memory device according to another embodiment of the present invention.

The basic circuit structure and operation principles of the semiconductor memory device shown in FIG. 6 are substantially the same as those of the semiconductor memory device shown in FIG. 5, and thus an adjustment voltage supply unit 122 and an amplification activation unit 132 other than the above identical components will hereinafter be described in detail.

In FIG. 6, the adjustment voltage supply unit 122 is coupled between a third voltage (VC) terminal and the nodes T1 and T2 of the amplification unit 111, and performs a switching operation in response to the voltage adjustment signal supplied from the voltage adjustment circuit 120. As can be seen from FIG. 6, the adjustment voltage supply unit 122 includes an NMOS transistor N9 for coupling the third voltage terminal (i.e., an adjustment voltage supply terminal) to each of the first and second amplification units 1111 and 1112. In this case, an adjustment voltage having a third voltage level VC is provided to the first amplification unit 1111 and the second amplification unit 1112 through the adjustment voltage supply terminal.

In the adjustment voltage supply unit 122, one NMOS transmission N9 is simultaneously coupled to the nodes T1 and T2, differently from the adjustment voltage supply unit 121 shown in FIG. 5. As a result, an internal area of the semiconductor memory device can be effectively utilized.

Meanwhile, the adjustment voltage supply unit 121 shown in FIG. 5 adjusts a voltage using two transistors, such that a voltage adjusting speed can be increased.

The amplification activation unit 132 is coupled between the ground terminal and the internal nodes T1 and T2 of the amplification unit 111, and performs a switching operation in response to the amplification control signal supplied from the amplification control circuit 130. As shown in FIG. 6, the amplification activation unit 132 includes an NMOS transistor N10 for coupling the ground terminal to each of the first and second amplification units 1111 and 1112.

That is, in the amplification activation unit 132, one NMOS transistor N10 is simultaneously coupled to the nodes T1 and T2, differently from the amplification activation unit 131 shown in FIG. 5. As a result, the internal area of the semiconductor memory device can be effectively utilized.

In the meantime, the amplification activation unit 131 shown in FIG. 5 amplifies a voltage using two transistors, such that a voltage amplification speed can be increased.

Figure 7:
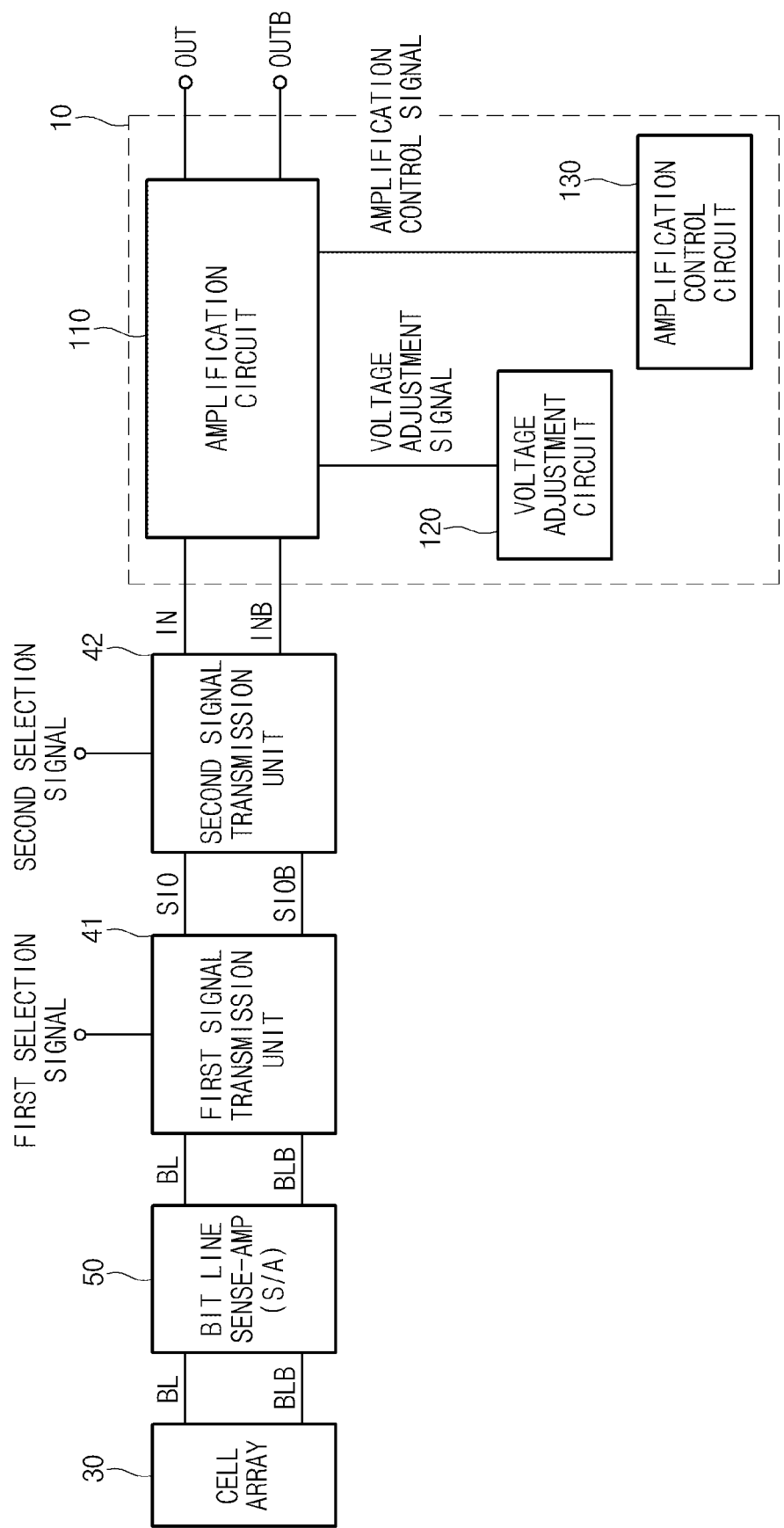
FIG. 7 is a block diagram illustrating a semiconductor memory device including the integrated circuit shown in FIG. 1 according to another embodiment of the present invention.

FIG. 7 is a block diagram illustrating a semiconductor memory device including the integrated circuit shown in FIG. 1 according to another embodiment of the present invention.

Referring to FIG. 7, the semiconductor memory device includes all of the constituent elements of the semiconductor memory device shown in FIG. 3, and further includes a bit-line sense-amplifier (S/A) 50.

The bit-line sense-amplifier (S/A) 50 detects data sensed by a unit cell of the cell array 30. The data detected by the bit-line sense-amplifier (S/A) 50 is transferred to the integrated circuit 10 through first and second signal transmission units 41 and 42.

The first signal transmission unit 41 and the second transmission unit 42 may selectively pass the detected data in response to a first selection signal and a second selection signal, respectively.

Each of the first signal transmission unit 41 and the second signal transmission unit 42 may include a switching element.

Figure 8:
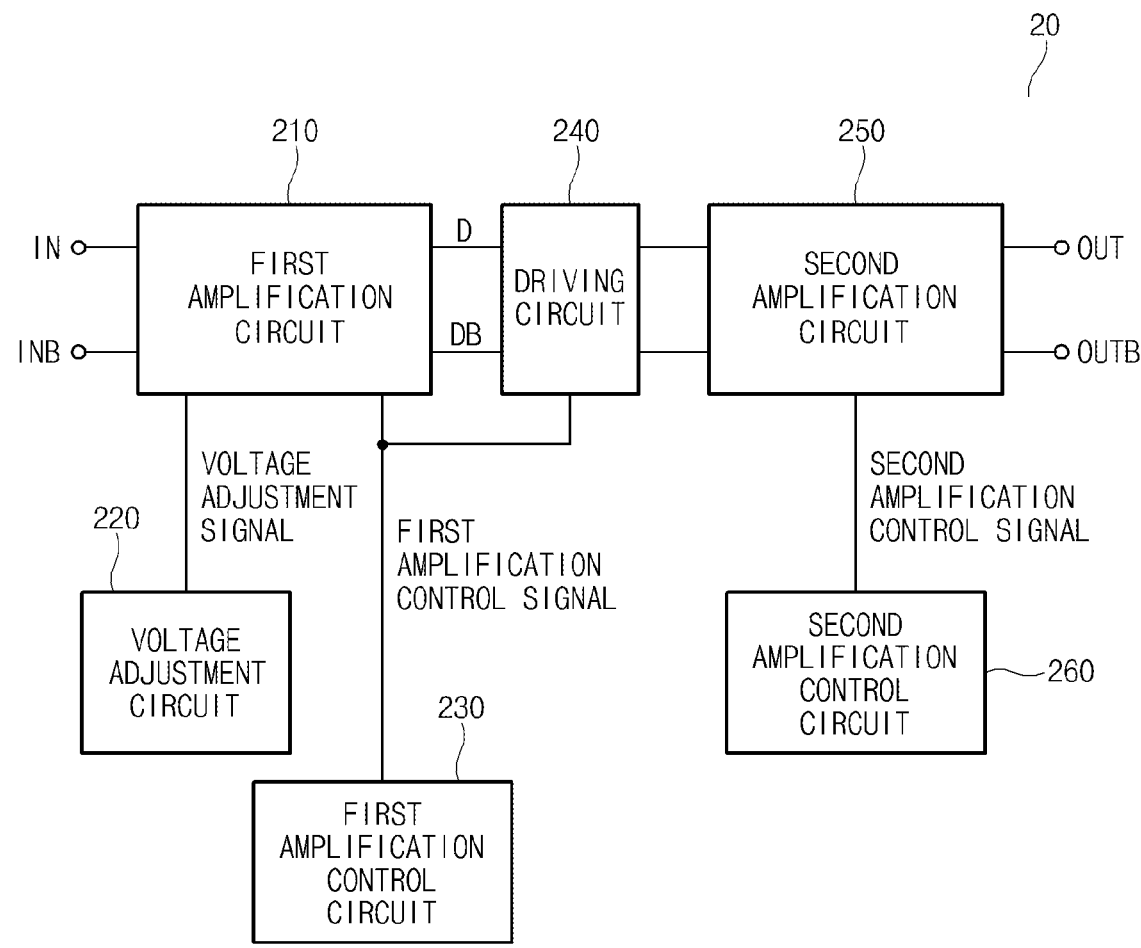
FIG. 8 is a block diagram illustrating an integrated circuit according to another embodiment of the present invention.

FIG. 8 is a block diagram illustrating an integrated circuit according to another embodiment of the present invention.

Referring to FIG. 8, the integrated circuit 20 according to this embodiment of the present invention includes a first amplification circuit 210, a voltage adjustment circuit 220, a first amplification control circuit 230, a driving circuit 240, a second amplification circuit 250, and a second amplification control circuit 260.

The first amplification circuit 210 amplifies a voltage difference between input signals IN and INB, and thus generates output signals D and DB.

The voltage adjustment circuit 220 adjusts an internal voltage level of the first amplification circuit 210. The voltage adjustment circuit 220 outputs a voltage adjustment signal, such that it adjusts the internal voltage level of the first amplification circuit 210.

The first amplification control circuit 230 controls an amplification operation of the first amplification circuit 210. In the case where the first amplification control circuit 230 is activated and outputs an enabled first amplification control signal, the first amplification circuit 210 performs the amplification operation. In contrast, in the case where the first amplification control circuit 230 is deactivated and outputs a disabled first amplification control signal, the first amplification circuit 210 stops the amplification operation.

The driving circuit 240 drives the output signals D and DB of the first amplification circuit 210, such that it outputs the driven signals to the second amplification circuit 250.

In more detail, while the first amplification circuit 210 performs the amplification operation in response to the enabled first amplification control signal, the driving circuit 240 is deactivated. Also, after the disabled first amplification control signal is generated and before the second amplification circuit 250 performs its amplification operation, the driving circuit 240 is activated. Since the amplification operation is sequentially performed in a two-stage amplification circuit such as the integrated circuit according to this embodiment of the present invention, it is not necessary for the first amplification circuit 210 and the second amplification circuit 250 to operate at the same time.

Therefore, the driving circuit 240 is deactivated until first-stage amplification is completed, such that signals input to the second amplification circuit 250 is not driven. Then, the driving circuit 240 is activated at a time at which the first-stage amplification is completed, and drives the signals input to the second amplification circuit 250, such that power consumption of the first and second amplification circuits 210 and 250 can be minimized.

The second amplification circuit 250 amplifies the signals from the driving circuit 240, and generates output signals OUT and OUTB.

The second amplification control circuit 260 controls an amplification operation of the second amplification circuit 250. In the case where the second amplification control circuit 260 is activated and outputs an enabled second amplification control signal, the second amplification circuit 250 performs the amplification operation. In contrast, in the case where the second amplification control circuit 260 is deactivated and outputs a disabled second amplification control signal, the second amplification circuit 250 stops the amplification operation.

Figure 9:
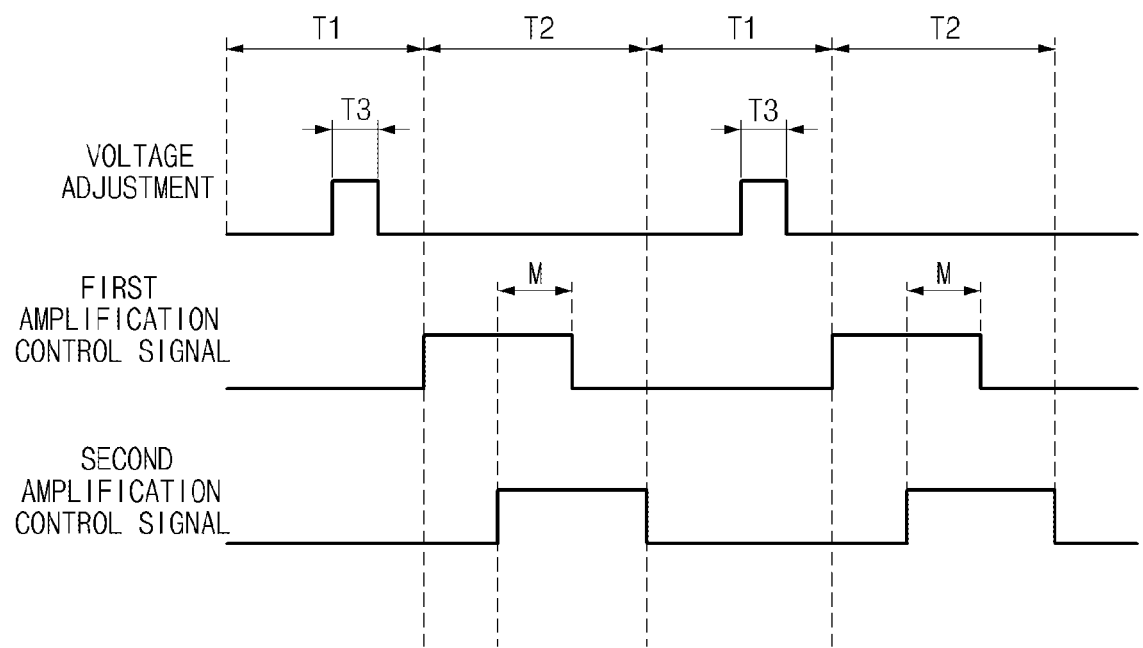
FIG. 9 is a timing diagram illustrating an operation of the integrated circuit shown in FIG. 8 according to an embodiment of the present invention.

FIG. 9 is a timing diagram illustrating an operation of the integrated circuit shown in FIG. 8 according to an embodiment of the present invention.

Referring to FIG. 9, the voltage adjustment circuit 220 activates the voltage adjustment signal during a third interval T3 contained in a first interval T1 in which the first amplification control signal and the second amplification control signal are deactivated. As a result, before the first amplification circuit 210 performs the amplification operation, the internal voltage of the first amplification circuit 210 can be adjusted to a specific voltage level. In this case, the third interval T3 is contained in the first interval T1, and the length of an activation interval thereof may be set by a user.

In the case where the first amplification control signal is activated in a second interval T2, the first amplification circuit 210 starts the amplification operation. The first amplification control signal is activated at the beginning of the second interval T2, and is then deactivated near the center of the second interval T2. The second amplification control signal is activated near the center of the second interval T2, and is then deactivated at the end of the second interval T2. The first amplification control signal and the second amplification signal are simultaneously activated in a specific interval M, and the length of the specific interval M may be changed according to user's setup information.

Figure 10:
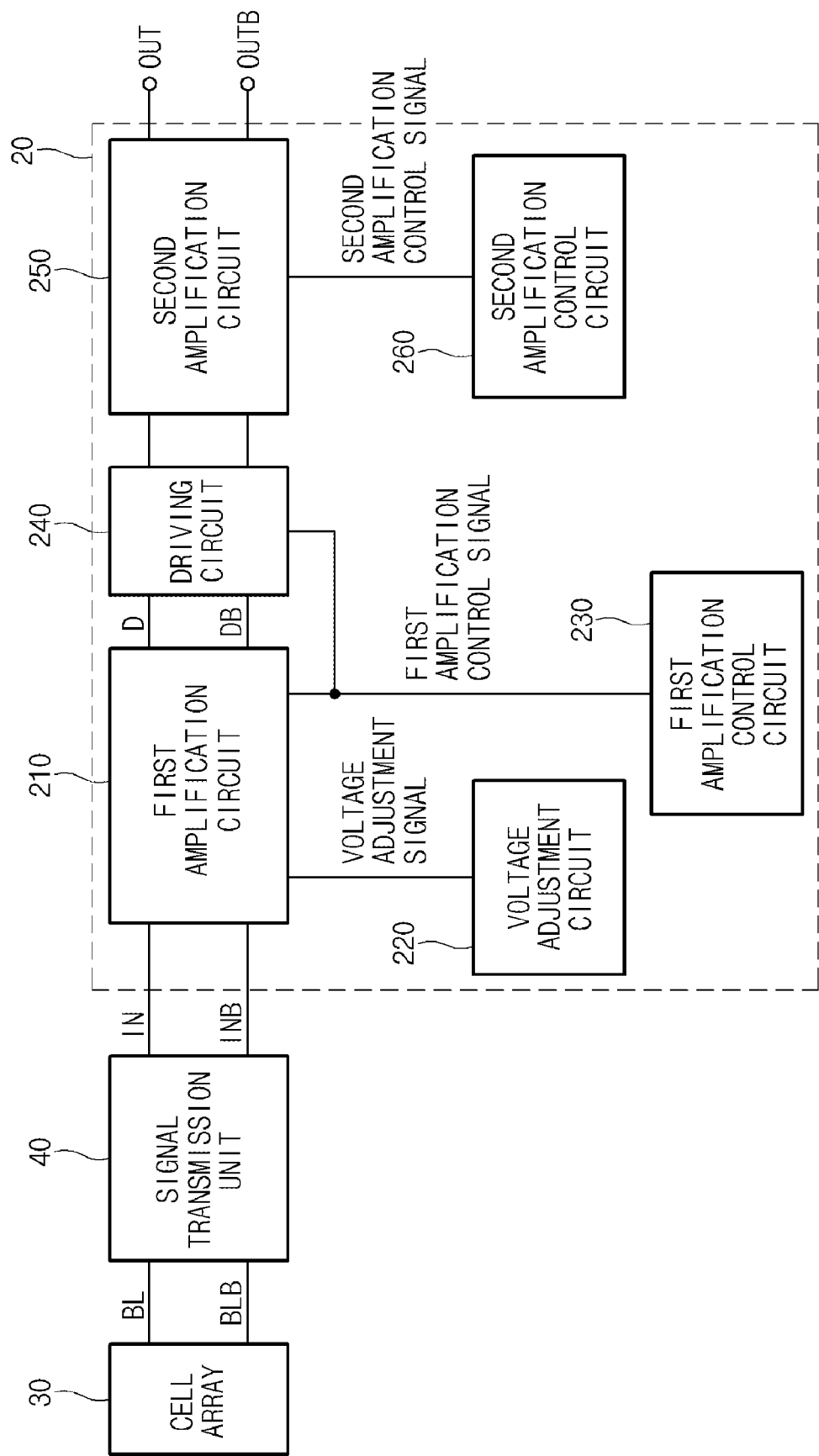
FIG. 10 is a block diagram illustrating a semiconductor memory device including the integrated circuit shown in FIG. 8 according to an embodiment of the present invention.

FIG. 10 is a block diagram illustrating a semiconductor memory device including the integrated circuit shown in FIG. 8 according to an embodiment of the present invention. In more detail, FIG. 10 illustrates a semiconductor memory device which uses the integrated circuit shown in FIG. 8 as a sense-amplifier (S/A).

Referring to FIG. 10, the semiconductor memory device includes an integrated circuit 20, a cell array 30, and a signal transmission unit 40. In the same manner as in the above embodiment, the integrated circuit 20 includes a first amplification circuit 210, a voltage adjustment circuit 220, a first amplification control circuit 230, a driving circuit 240, a second amplification circuit 250, and a second amplification control circuit 260. Operations of the integrated circuit 20 have already been described with reference to FIGS. 8 and 9. Therefore, only elements other than the integrated circuit 20 and operational principles of the semiconductor memory device will hereinafter be described in detail.

The cell array 30 includes a plurality of unit cells. Each unit cell includes a memory device. For example, a capacitor, a magnetic resistance element, a phase change resistance element, a ferroelectric element, etc. may be used as the memory device. The integrated circuit according to another embodiment of the present invention can be applied to all types of semiconductor memory devices, which are capable of amplifying a current signal out of a memory element contained in a unit cell, irrespective of memory device types.

The signal transmission unit 40 transmits current signals from the cell array 30 through a pair of bit lines BL and BLB to the first amplification circuit 210. If a selection signal is activated, the signal transmission unit 40 transmits the current signals through the bit-line pair BL and BLB to the first amplification circuit 210. Otherwise, if the selection signal is deactivated, the signal transmission unit 40 does not transmit the current signals through the bit-line pair BL and BLB to the first amplification circuit 210.

The signal transmission unit 40 may include a switching element. For example, a metal oxide semiconductor (MOS) transistor, a bipolar junction transistor, etc. may be used as the switching element, but the scope or spirit of the present invention is not limited only thereto, and other switching elements can also be used in the present invention.

Figure 11:
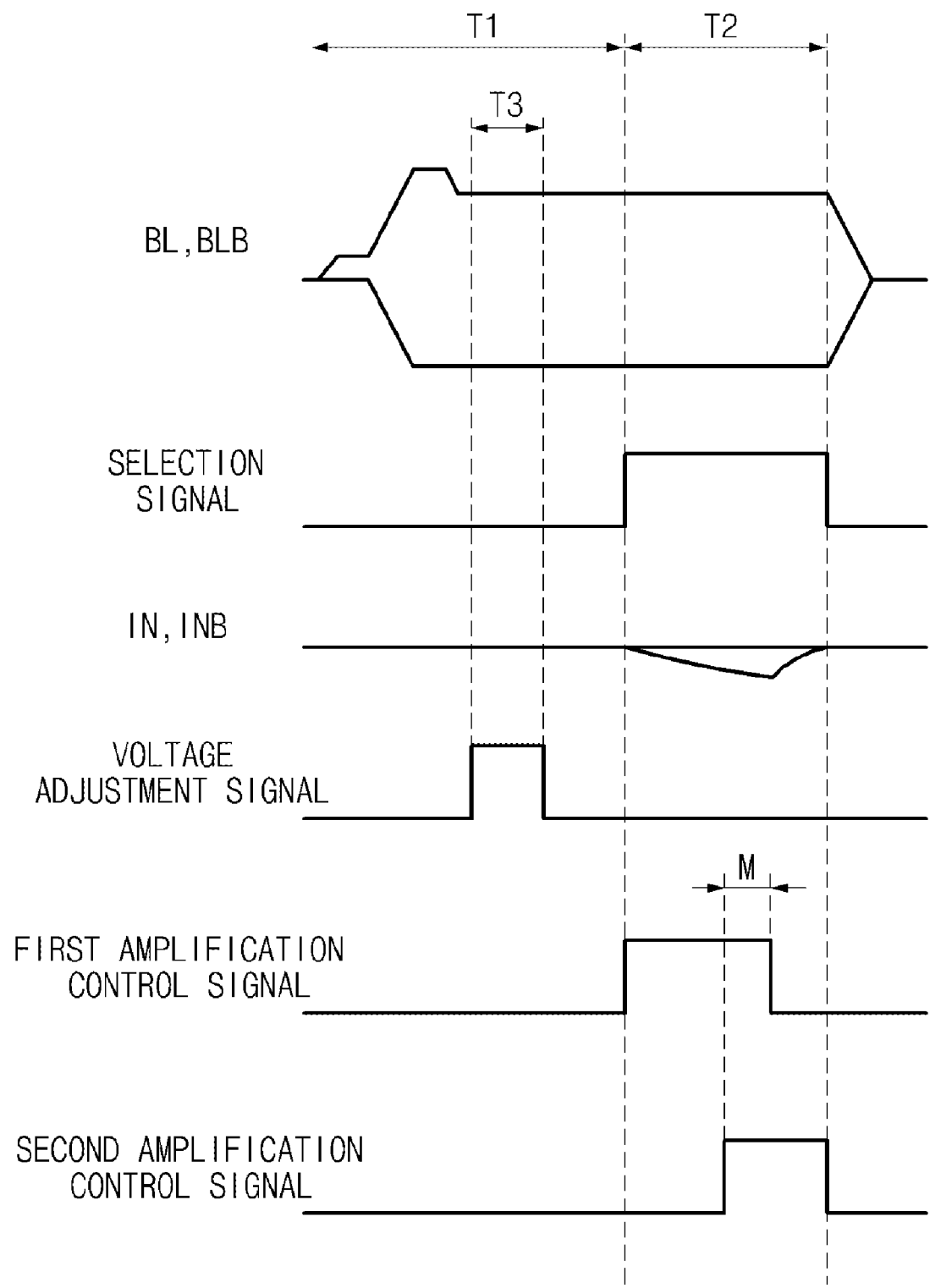
FIG. 11 is a timing diagram illustrating an operation of the semiconductor memory device shown in FIG. 10 according to an embodiment of the present invention.

FIG. 11 is a timing diagram illustrating an operation of the semiconductor memory device shown in FIG. 10 according to an embodiment of the present invention.

Referring to FIG. 11, prior to the beginning of a read operation of the semiconductor memory device including the integrated circuit, the same voltage level is maintained in the pair of bit lines BL and BLB. For example, voltage levels of the bit lines BL and BLB may be set to 0V or a precharge voltage level.

When the read operation for a specific unit cell contained in the cell array 30 starts, a current signal begins to flow through the bit-line pair BL and BLB. However, during a first interval T1 in which a selection signal is deactivated, the current signal that flows through the bit-line pair BL and BLB is not transferred to the first amplification circuit 210 through the signal transmission unit 40.

Meanwhile, in the second interval T2 in which the selection signal is activated, a current from the cell array 30 is input to the first amplification circuit 210 via the signal transmission unit 40. That is, input signals IN and INB of the first amplification circuit 210 are maintained at the same voltage level under the condition that the supply of current is blocked by the signal transmission unit 40. After that, if the supply of current begins by a switching operation of the signal transmission unit 40, there arises a difference in voltage levels between the input signals IN and INB and this difference is gradually increased. In contrast, if the signal transmission unit 40 is re-switched so that the supply of current is re-blocked, the voltage levels of the input signals IN and INB are again maintained at the same level.

As can be seen from the above description, in the integrated circuit 20 according to an embodiment of the present invention, during the third interval T3 where the voltage adjustment signal is activated, the voltage adjustment circuit 220 adjusts an internal voltage level of the first amplification circuit 210 to a specific voltage level. Herein, the third interval T3 is contained in the first interval T1 where the selection signal and the amplification control signal are deactivated. For example, the voltage adjustment circuit 220 may adjust each internal voltage level of the first amplification circuit 210 to a ground-voltage level in response to the voltage adjustment signal. As a result, it is possible to substantially prevent noise from being generated in voltage levels of the input signals IN and INB by an unexpected internal voltage that may be generated in the first amplification circuit 210.

In more detail, in the case where the voltage adjustment signal is not used, the voltage levels of the input signals IN and INB may not be maintained at the same value owing to noise generated by internal parasitic capacitance of the first amplification circuit 210. The first amplification circuit 210 correctly achieves the amplification operation only under a predetermined condition in which the voltage levels of the input signals IN and INB are correctly controlled. Assuming that noise occurs, the first amplification circuit 210 may perform an undesired amplification operation, or a necessary amplification operation may not be unexpectedly performed.

However, assuming that the voltage adjustment circuit 220 correctly adjusts the internal voltage level of the first amplification circuit 210 prior to the execution of the amplification operation, a margin of the input signals IN and INB can be correctly controlled, such that the first amplification circuit 210 can accurately perform the amplification operation.

In the above-mentioned embodiment, the third interval T3 for activating the voltage adjustment signal may be contained in the first interval T1, and the length of an activation interval of the third interval T3 may be changed according to user's setup information.

After the voltage adjustment circuit 220 adjusts the internal voltage level of the first amplification circuit 210 in response to the voltage adjustment signal during the third interval T3, the first amplification circuit 210 amplifies a voltage difference between the input signals IN and INB and thus outputs the output signals D and DB. The second amplification circuit 250 amplifies a voltage difference between output signals of the driving circuit 240 having received the output signals D and DB in response to a second amplification control signal, and then outputs the output signals OUT and OUTB.

As described above, the first amplification control signal and the second amplification control signal are sequentially activated, and share an activation region during the specific interval M. The reason why the first and second amplification control signals share the activation region is as follows. The first amplification circuit 210 performs the amplification operation in response to the first amplification control signal, and the second amplification circuit 250 then performs the amplification operation in response to the second amplification control signal. Assuming that the first and second amplification circuits 210 and 250 do not share the activation region, the amplification operation may be unexpectedly halted.

Figure 12:
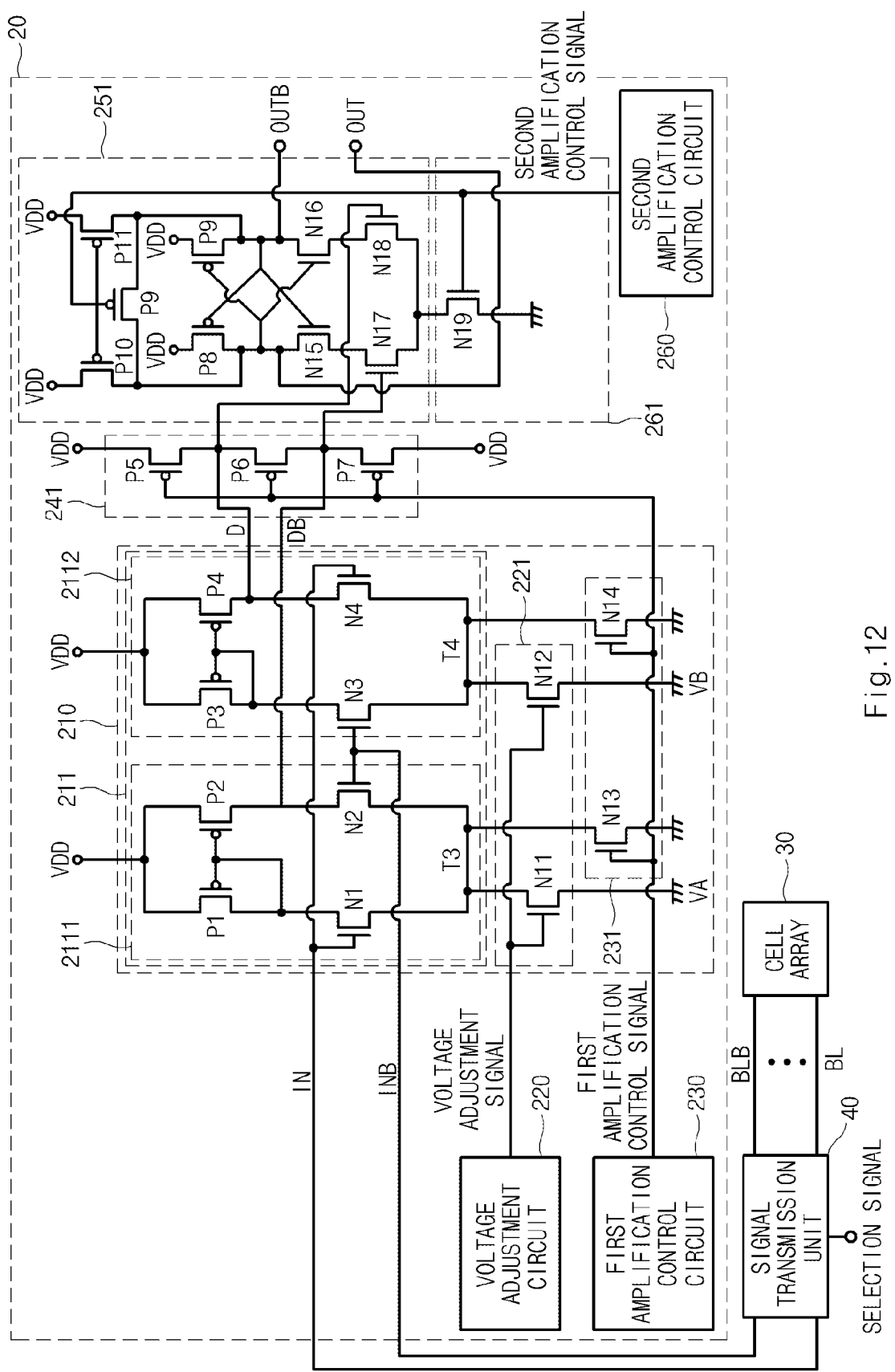
FIG. 12 is a circuit diagram illustrating the semiconductor memory device shown in FIG. 10 according to an embodiment of the present invention.

FIG. 12 is a circuit diagram illustrating the semiconductor memory device shown in FIG. 10 according to an embodiment of the present invention.

Referring to FIG. 12, the semiconductor memory device including the integrated circuit according to this embodiment of the present invention includes an integrated circuit 20, a cell array 30, and a signal transmission unit 40.

The semiconductor memory device shown in FIG. 12 has the same basic circuit structure as in FIG. 10, and thus only internal circuits of the integrated circuit 20 will hereinafter be described in detail with reference to the accompanying drawings.

Referring to FIG. 12, the integrated circuit 20 includes a first amplification circuit 210 having an amplification unit 211, an adjustment voltage supply unit 221, and an amplification activation unit 231.

The amplification unit 211 includes a first amplification unit 2111 and a second amplification unit 2112.

The first amplification unit 2111 and the second amplification unit 2112 receive input signals IN and INB, and amplify a voltage difference between the input signals IN and INB.

In more detail, the first amplification unit 2111 amplifies the voltage difference between the input signals IN and INB, and generates an output signal DB. The second amplification unit 2112 amplifies the voltage difference between the input signals IN and INB, and generates an output signal D. Voltage levels of the output signals D and DB are dependent upon characteristics of individual transistors contained in the first and second amplification units 2111 and 2112.

In more detail, in the first amplification unit 2111, PMOS transistors P1 and P2 operate as loads, and NMOS transistors N1 and N2 adjust the magnitude of current passing therethrough in response to the input signals IN and INB, such that a voltage level of the output signal DB is determined.

For example, assuming that the PMOS transistor P2 has a large load and the magnitude of current passing through the NMOS transistor N2 is large, a voltage induced to the PMOS transistor P2 serving as a load increases, such that the output signal DB becomes a low voltage level.

In contrast, assuming that the PMOS transistor P2 has a small load and the magnitude of current passing through the NMOS transistor N2 is small, the voltage induced to the PMOS transistor P2 decreases, such that the output signal DB becomes a high voltage level.

In the same manner as in the first amplification unit 2111, in the second amplification unit 2112, PMOS transistors P3 and P4 operate as loads, and NMOS transistors N3 and N4 adjust the magnitude of current passing therethrough in response to the input signals IN and INB, such that a voltage level of the output signal D is determined.

For example, assuming that the PMOS transistor P4 has a large load and the magnitude of current passing through the NMOS transistor N4 is large, a voltage induced to the PMOS transistor P4 serving as a load increases, such that the output signal D becomes a low voltage level.

In contrast, assuming that the PMOS transistor P4 has a small load and the magnitude of current passing through the NMOS transistor N4 is small, the voltage induced at the PMOS transistor P4 decreases, such that the output signal D becomes a high voltage level.

The adjustment voltage supply unit 221 is coupled between an adjustment voltage supply terminal and each of internal nodes T3 and T4 of the amplification unit 211, and performs a switching operation in response to the voltage adjustment signal supplied from the voltage adjustment circuit 220. As can be seen from FIG. 12, the adjustment voltage supply unit 221 includes an NMOS transistor N11 and an NMOS transistor N12. The NMOS transistor N11 is used as a first adjustment voltage supply unit for coupling the first amplification unit 2111 to a first voltage (VA) terminal. The NMOS transistor N12 is used as a second adjustment voltage supply unit for coupling the second amplification unit 2112 to a second voltage (VB) terminal. Herein, the first and second voltage terminals may be a ground terminal.

In this case, the voltage adjustment signal is input to gate terminals of the NMOS transistors N11 and N12. The drain terminals of the NMOS transistors N11 and N12 are connected to the nodes T3 and T4, respectively. The source terminals of the NMOS transistors N11 and N12 are connected to the VA and VB terminals, respectively.

By means of the voltage adjustment signal, which is activated before the selection signal is activated (i.e., before the current is applied from the cell array 30 to the amplification unit 211 through the bit-line pair BL and BLB), the adjustment voltage supply unit 221 adjusts a voltage level of the node T3 to a first voltage level VA, and adjusts a voltage level of the node T4 to a second voltage level VB.

For example, the first voltage level VA and the second voltage level VB may be set to a ground voltage level. In this case, since the amount of electric charge stored in the node T3 or T4 may be zero, noise caused by parasitic capacitance generated between the node T3 or T4 and the input signals IN and INB can be substantially prevented from being generated.

The amplification activation unit 231 is coupled between the ground terminal and the nodes T3 and T4 of the amplification unit 211, and performs a switching operation in response to the amplification control signal supplied from the first amplification control circuit 230. As shown in FIG. 12, the amplification activation unit 231 includes an NMOS transistor N13 for coupling the first amplification unit 2111 to the ground terminal, and an NMOS transistor N14 for coupling the second amplification unit 2112 to the ground terminal.

In this case, the first amplification control signal is input to gate terminals of the NMOS transistors N13 and N14, drain terminals of the NMOS transistors N13 and N14 are coupled to the nodes T3 and T4, respectively, and source terminals thereof are coupled to the ground terminal.

If the first amplification control signal is activated after the selection signal is activated, the amplification activation unit 231 couples the nodes T3 and T4 to the ground terminal, such that it allows the amplification unit 211 to perform the amplification operation. That is, it is impossible for the current to flow in the amplification unit 211 under the condition that the NMOS transistors N13 and N14 of the amplification activation unit 231 are turned off. Therefore, although there is a voltage difference between the input signals IN and INB, it is impossible for the amplification unit 211 to amplify this voltage difference. On the other hand, if the NMOS transistors N13 and N14 of the amplification activation unit 231 are turned on, the current flows in the amplification unit 211, such that the amplification unit 211 can perform the amplification operation.

The driving circuit 241 drives the signals D and DB output from the first amplification circuit 210, and outputs the output signals D and DB to the second amplification circuit 250. The driving operation of the driving circuit 241 is controlled by the first amplification control signal. If the first amplification signal is activated, the driving operation of the driving circuit 241 is deactivated. If the first amplification control signal is deactivated, the driving operation of the driving circuit 241 is activated.

The driving circuit 241 implements the above-mentioned operation using three PMOS transistors P5, P6 and P7. If the first amplification control signal is activated and input as a high level to the driving circuit 241, all the PMOS transistors P5, P6 and P7 are turned off, such that the driving operation is not performed. On the other hand, if the first amplification control signal is deactivated and input as a low level to the driving circuit 241, all the PMOS transistors P5, P6 and P7 are turned on, such that the output signals D and DB are driven by a power-supply voltage VDD.

If the driven signals of the output signals D and DB are input to the second amplification circuit 250, the second amplification circuit 250 amplifies a voltage difference between the received signals and generates the output signals OUT and OUTB.

In the same manner as in the first amplification circuit 211, the second amplification circuit 250 includes an amplification unit 251 and an amplification activation unit 261. The amplification activation unit 261 is turned on by the activation of the second amplification control signal supplied from the second amplification control circuit 260, such that it allows the second amplification circuit 250 to perform the amplification operation. The amplification activation unit 261 may include an NMOS transistor N19, the second amplification control signal is input to a gate terminal of the NMOS transistor N19, a drain terminal is coupled to the amplification unit 251, and a source terminal is coupled to the ground terminal.

Figure 13:
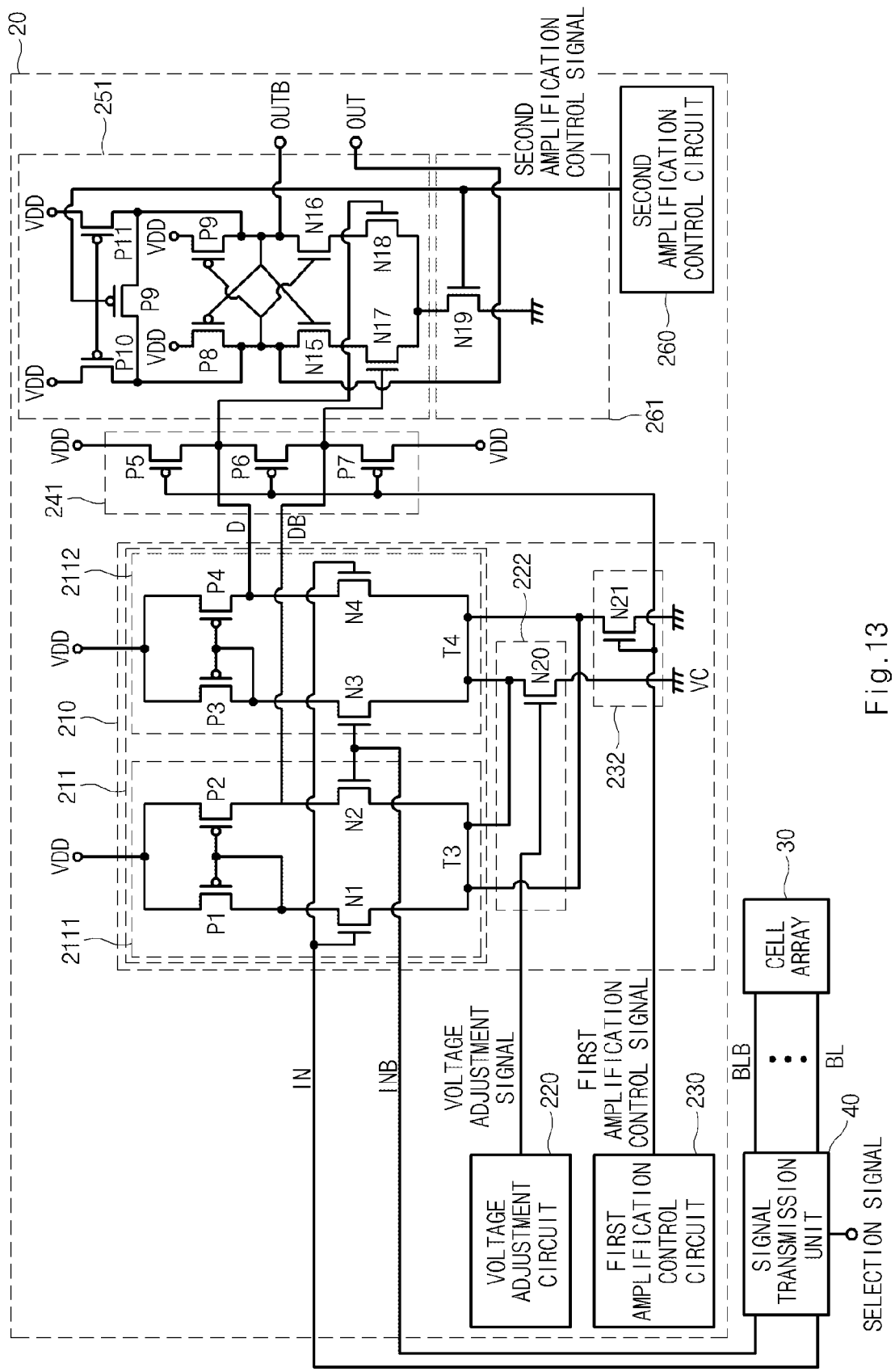
FIG. 13 is a circuit diagram illustrating the semiconductor memory device shown in FIG. 10 according to another embodiment of the present invention.

FIG. 13 is a circuit diagram illustrating the semiconductor memory device shown in FIG. 10 according to another embodiment of the present invention.

Referring to FIG. 13, the basic circuit structure and operation principles of the semiconductor memory device shown in FIG. 13 are substantially the same as those of the semiconductor memory device shown in FIG. 12, and thus only an adjustment voltage supply unit 222 and an amplification activation unit 232 will hereinafter be described in detail.

In FIG. 13, the adjustment voltage supply unit 222 is coupled between a third voltage (VC) terminal and the nodes T3 and T4 of the amplification unit 211, and performs a switching operation in response to the voltage adjustment signal supplied from the voltage adjustment circuit 220. As can be seen from FIG. 13, the adjustment voltage supply unit 222 includes an NMOS transistor N20 for coupling the third voltage (VC) terminal (i.e., an adjustment voltage supply terminal) to each of the first and second amplification units 2111 and 2112. In this case, an adjustment voltage having a third level VC is provided to the first amplification unit 2111 and the second amplification unit 2112 through the adjustment voltage supply terminal.

In the adjustment voltage supply unit 222, one NMOS transmission N20 is simultaneously coupled to the nodes T3 and T4, which is different from the adjustment voltage supply unit 221 shown in FIG. 12. As a result, an internal area of the semiconductor memory device can be effectively utilized.

Meanwhile, the adjustment voltage supply unit 221 shown in FIG. 12 adjusts a voltage using two transistors, such that a voltage adjusting speed can be increased.

The amplification activation unit 232 is coupled between the ground terminal and the internal nodes T3 and T4 of the amplification unit 211, and performs a switching operation in response to the first amplification control signal supplied from the first amplification control circuit 230. As shown in FIG. 13, the amplification activation unit 232 includes an NMOS transistor N21 for coupling the ground terminal to each of the first and second amplification units 2111 and 2112.

That is, in the amplification activation unit 232, one NMOS transistor N21 is simultaneously coupled to the nodes T3 and T4, which is different from the amplification activation unit 231 shown in FIG. 12. As a result, the internal area of the semiconductor memory device can be effectively utilized.

In the meantime, the amplification activation unit 231 shown in FIG. 12 amplifies a voltage using two transistors, such that a voltage amplification speed can be increased.

Figure 14:
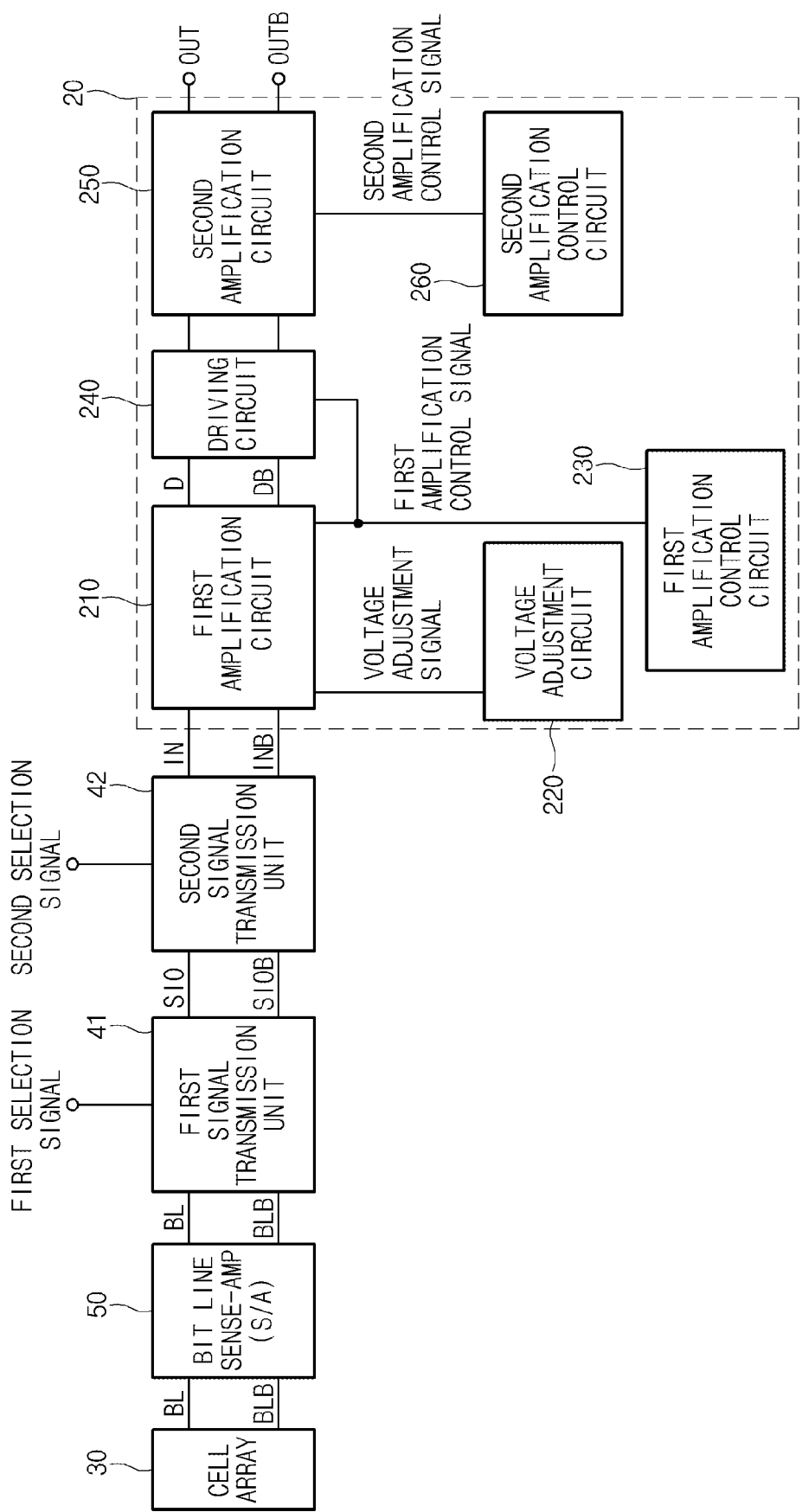
FIG. 14 is a block diagram illustrating a semiconductor memory device including the integrated circuit shown in FIG. 8 according to another embodiment of the present invention.

FIG. 14 is a block diagram illustrating a semiconductor memory device including the integrated circuit shown in FIG. 8 according to another embodiment of the present invention.

Referring to FIG. 14, the semiconductor memory device includes all of the constituent elements of the semiconductor memory device shown in FIG. 10, and further includes a bit-line sense-amplifier (S/A) 50.

The bit-line sense-amplifier (S/A) 50 detects data sensed by a unit cell of the cell array 30. The data detected by the bit-line sense-amplifier (S/A) 50 is transferred to the integrated circuit 10 through first and second signal transmission units 41 and 42.

The first signal transmission unit 41 and the second transmission unit 42 may selectively pass the detected data in response to a first selection signal and a second selection signal, respectively.

Each of the first signal transmission unit 41 and the second signal transmission unit 42 may include a switching element.

As apparent from the above description, the above-mentioned embodiments of the present invention have the following characteristics. A voltage adjustment circuit adjusts an internal voltage of an amplification circuit before performing an amplification operation, such that noise does not occur in a signal input to the amplification circuit at the beginning of the amplification operation. As a result, the semiconductor memory device according to the embodiment of the present invention can accurately control a margin of the input signal, resulting in the prevention of a faulty operation of the amplification circuit.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. An integrated circuit comprising:
    an amplification circuit configured to amplify an input signal;
    an amplification control circuit configured to output an amplification control signal for controlling an amplification operation of the amplification circuit; and
    a voltage adjustment circuit configured to output a voltage adjustment signal for adjusting an internal voltage of the amplification circuit before the amplification circuit performs the amplification operation,
    wherein the voltage adjustment circuit activates the voltage adjustment signal when the amplification control signal is deactivated.

2. The integrated circuit according to claim 1, wherein the amplification circuit includes:
    an amplification unit configured to amplify the input signal; and
    an adjustment voltage supply unit configured to provide an adjustment voltage to the amplification unit when the voltage adjustment signal is activated.

3. The integrated circuit according to claim 2, wherein the adjustment voltage supply unit is configured to allow the amplification unit to be grounded when the voltage adjustment signal is activated.

4. The integrated circuit according to claim 2, wherein the amplification circuit receives the input signal as part of a pair of input signals, and differentially amplifies the pair of input signals.

5. A semiconductor memory device comprising:
    a cell array including a plurality of unit cells;
    an amplification circuit configured to amplify an input signal received from at least one unit cell among the plurality of unit cells;
    a signal transmission unit configured to transmit the input signal to the amplification circuit in response to a selection signal;
    an amplification control circuit configured to output an amplification control signal for controlling an amplification operation of the amplification circuit; and
    a voltage adjustment circuit configured to output a voltage adjustment signal for adjusting an internal voltage of the amplification circuit before the amplification circuit performs the amplification operation.

6. The semiconductor memory device according to claim 5, wherein the signal transmission unit is configured to couple the cell array to the amplification circuit when the selection signal is activated.

7. The semiconductor memory device according to claim 6, wherein the amplification circuit includes:
    an amplification unit configured to amplify a signal received through a set of bit lines; and
    an adjustment voltage supply unit configured to provide an adjustment voltage to the amplification unit when the voltage adjustment signal is activated.

8. The semiconductor memory device according to claim 7, wherein the set of bit lines is a pair of bit lines.

9. The semiconductor memory device according to claim 7, wherein the adjustment voltage supply unit is configured to allow the amplification unit to be grounded when the voltage adjustment signal is activated.

10. The semiconductor memory device according to claim 6, wherein the amplification control circuit is configured to cause the amplification circuit to perform the amplification operation during a specific interval in which the selection signal is activated.

11. The semiconductor memory device according to claim 10, wherein the voltage adjustment circuit is configured to adjust the internal voltage of the amplification circuit during an interval in which the selection signal is deactivated.

12. The semiconductor memory device according to claim 9, wherein the amplification unit includes:
    a first amplification unit configured to amplify the signal received through the set of bit lines and generate a first output signal; and
    a second amplification unit configured to amplify the signal received through the set of bit lines and generate a second output signal.

13. The semiconductor memory device according to claim 12, wherein the adjustment voltage supply unit includes:
    a first adjustment voltage supply unit configured to provide the adjustment voltage of a first level to the first amplification unit; and
    a second adjustment voltage supply unit configured to provide the adjustment voltage of a second level to the second amplification unit.

14. The semiconductor memory device according to claim 12, wherein the adjustment voltage supply unit provides the adjustment voltage of a third level to each of the first and second amplification units.

15. An integrated circuit, comprising:
- a first amplification circuit configured to amplify an input signal;
- a first amplification control circuit configured to output a first amplification control signal for controlling an amplification operation of the first amplification circuit;
- a second amplification circuit configured to amplify an output signal of the first amplification circuit;
- a second amplification control circuit configured to output a second amplification control signal for controlling an amplification operation of the second amplification circuit; and
- a voltage adjustment circuit configured to output a voltage adjustment signal for adjusting an internal voltage of the first amplification circuit before the first and second amplification circuits perform the amplification operation.

16. The integrated circuit according to claim 15, wherein the first amplification circuit includes:
- an amplification unit configured to amplify the input signal; and
- an adjustment voltage supply unit configured to provide an adjustment voltage to the amplification unit when the voltage adjustment signal is activated.

17. The integrated circuit according to claim 16, wherein the adjustment voltage supply unit is configured to allow the first amplification unit to be grounded when the voltage adjustment signal is activated.

18. The integrated circuit according to claim 15, wherein the first amplification circuit is configured to receive a set of input signals, and differentially amplify the set of input signals.

19. The integrated circuit according to claim 18, further comprising:
- a driving circuit configured to drive the output signal of the first amplification circuit, and output a driven signal to the second amplification circuit,
- wherein the set of input signals is a pair of input signals.

20. The integrated circuit according to claim 19, wherein the driving circuit is configured to operate in response to the first amplification control signal.

21. A semiconductor memory device comprising:
- a cell array including a plurality of unit cells;
- a first amplification circuit configured to amplify an input signal received from at least one unit cell among the plurality of unit cells;
- a signal transmission unit configured to transmit the input signal to the first amplification circuit in response to a selection signal;
- a first amplification control circuit configured to output a first amplification control signal for controlling an amplification operation of the first amplification circuit;
- a second amplification circuit configured to amplify an output signal of the first amplification circuit;
- a second amplification control circuit configured to output a second amplification control signal for controlling an amplification operation of the second amplification circuit; and
- a voltage adjustment circuit configured to output a voltage adjustment signal for adjusting an internal voltage of the first amplification circuit before the first and second amplification circuits perform the amplification operation.

22. The semiconductor memory device according to claim 21, wherein the signal transmission unit is configured to couple the cell array to the first amplification circuit when the selection signal is activated.

23. The semiconductor memory device according to claim 22, wherein the first amplification circuit includes:
- an amplification unit configured to amplify input signals received through a set of bit lines; and
- an adjustment voltage supply unit configured to provide an adjustment voltage to the amplification unit when the voltage adjustment signal is activated.

24. The semiconductor memory device according to claim 23, wherein the adjustment voltage supply unit is configured to allow the amplification unit to be grounded when the voltage adjustment signal is activated.

25. The semiconductor memory device according to claim 23, wherein the amplification unit is configured to amplify a voltage difference between the input signals received from the bit line set.

26. The semiconductor memory device according to claim 21, wherein the first amplification control circuit is configured to cause the first amplification circuit to perform the amplification operation during a specific interval in which the selection signal is activated.

27. The semiconductor memory device according to claim 26, wherein the second amplification control circuit is configured to cause the second amplification circuit to perform the amplification operation during a specific interval in which the first amplification control signal is activated.

28. The semiconductor memory device according to claim 26, wherein the voltage adjustment circuit is configured to adjust the internal voltage of the first amplification circuit during an interval in which the selection signal is deactivated.

29. The semiconductor memory device according to claim 21, further comprising:
- a driving circuit configured to drive the output signal of the first amplification circuit, and output a driven signal to the second amplification circuit.

30. The semiconductor memory device according to claim 29, wherein the driving circuit is configured to operate in response to the first amplification control signal.

31. The semiconductor memory device according to claim 23, wherein the amplification unit includes:
- a first amplification unit configured to amplify the input signals received through the set of bit lines, and generate a first output signal, the set of bit lines being a pair; and
- a second amplification unit configured to amplify the input signals received through the set of bit lines, and generate a second output signal.

32. The semiconductor memory device according to claim 31, wherein the adjustment voltage supply unit includes:
- a first adjustment voltage supply unit configured to provide the adjustment voltage of a first level to the first amplification unit; and
- a second adjustment voltage supply unit configured to provide the adjustment voltage of a second level to the second amplification unit.

33. The semiconductor memory device according to claim 31, wherein the voltage adjustment circuit provides the adjustment voltage of a third level to each of the first and second amplification units.

34. The semiconductor memory device according to claim 30, wherein the second amplification circuit is configured to amplify a voltage difference between signals input from the driving circuit.

* * * * *